(12) United States Patent
Patterson (10) Patent No.: US 8,106,665 B2
(45) Date of Patent: Jan. 31, 2012

(54) 3-D MAPPING FOCUSED BEAM FAILURE ANALYSIS

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 481 days.

(21) Appl. No.: 12/388,200

(22) Filed: Feb. 18, 2009

(65) Prior Publication Data

US 2009/0322343 A1 Dec. 31, 2009

Related U.S. Application Data

(63) Continuation-in-part of application No. 12/330,376, filed on Dec. 8, 2008, which is a continuation-in-part of application No. 12/242,545, filed on Sep. 30, 2008, now Pat. No. 7,931,849, which is a continuation-in-part of application No. 12/145,566, filed on Jun. 25, 2008, now Pat. No. 7,932,119, application No. 12/388,200, which is a continuation-in-part of application No. 12/352,640, filed on Jan. 13, 2009, now Pat. No. 7,768,706.

(51) Int. Cl.
*G01R 31/311* (2006.01)

(52) U.S. Cl. .................................. 324/501; 250/341.4
(58) Field of Classification Search .................. 385/146; 324/501; 250/341.4
See application file for complete search history.

(56) References Cited

U.S. PATENT DOCUMENTS 5,272,342 A * 12/1993 Kotani ........................ 250/341.4
6,711,186 B2 * 3/2004 Komeda ....................... 372/29.02
6,996,316 B2 * 2/2006 Bailey et al. .................. 385/123

* cited by examiner

*Primary Examiner* — Constantine Hannaher
(74) *Attorney, Agent, or Firm* — Law Office of Gerald Maliszewski; Gerald Maliszewski (57) ABSTRACT

A reflector tool and a method are provided for three-dimensional integrated circuit (IC) failure analysis. An IC (die) has top and bottom surfaces, a perimeter, and a first side. The IC is electrically connected to a current sensing amplifier. The first side of the IC is scanned in the X plane with an infrared laser beam while changes in IC current flow are sensed. The sensed current changes are cross-referenced to the location of the infrared laser beam in the X plane. In one aspect, a plurality of scans are performed on the first side in the X plane, with a corresponding plurality of steps in the Y plane, so that current changes can be cross-referenced to locations in the X and Y planes. Using this 2-D analysis through the IC side, a human operator or software program can determine defects in the IC.

21 Claims, 7 Drawing Sheets

3-D MAPPING FOCUSED BEAM FAILURE ANALYSIS

RELATED APPLICATIONS

This application is a Continuation-in-Part of a pending application entitled, INTEGRATED CIRCUIT COOLING APPARATUS FOR FOCUSED BEAM PROCESSES, invented by Joseph Patterson, Ser. No. 12/330,376, filed Dec. 8, 2008;

which is a Continuation-in-Part of a application entitled, NON-DESTRUCTIVE LASER OPTICAL INTEGRATED CIRCUIT PACKAGE MARKING, invented by Joseph Patterson, Ser. No. 12/242,545, filed Sep. 30, 2008, now U.S. Pat. No. 7,931,849;

which is a Continuation-in-Part of a application entitled, LASER OPTICAL PATHWAY DETECTION IN INTEGRATED CIRCUIT PACKAGING, invented by Joseph Patterson, Ser. No. 12/145,566, filed Jun. 25, 2008, now U.S. Pat. No. 7,932,119.

This application is also a Continuation-in-Part of a application entitled, OPTICAL FIBER MICRO ARRAY LENS, invented by Joseph Patterson, Ser. No. 12/352,640, filed Jan. 13, 2009, now U.S. Pat. No. 7,768,706. All of the above-referenced applications are incorporated herein by reference.

BACKGROUND OF THE INVENTION

1. Field of the Invention

This invention generally relates to integrated circuit (IC) fabrication and, more particularly, to a method and tool for IC imaging failure analysis, especially stacked IC dies where access can only be obtained from the side.

2. Description of the Related Art

IC devices are formed from a die of active semiconductor devices. The die can be mounted in a hybrid circuit, printed circuit board (PCB), or a package. For environmental protection, the die may be covered by a passivation layer. However, a package is more typically used since it also dissipates heat and provides a lead system for electrical connections. There are many different types of packages including through-hole, surface mount device (SMD) dual/quad, and SMD area array packages.

Figure 1A:
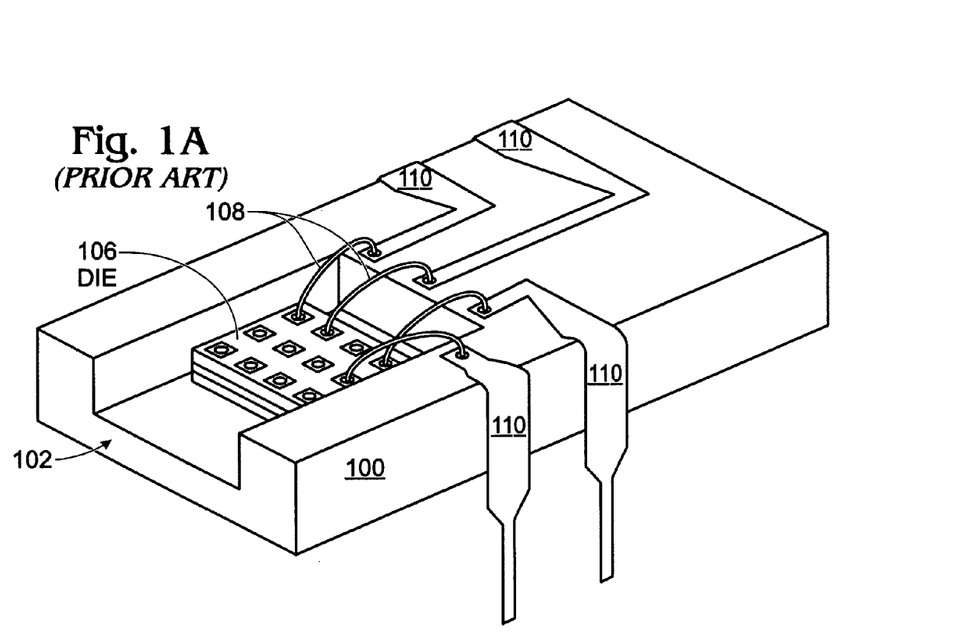
FIGS. 1A and 1B are perspective views of a dual in-line package (DIP) and an IC die without a package, respectively (prior art).
Figure 1B:
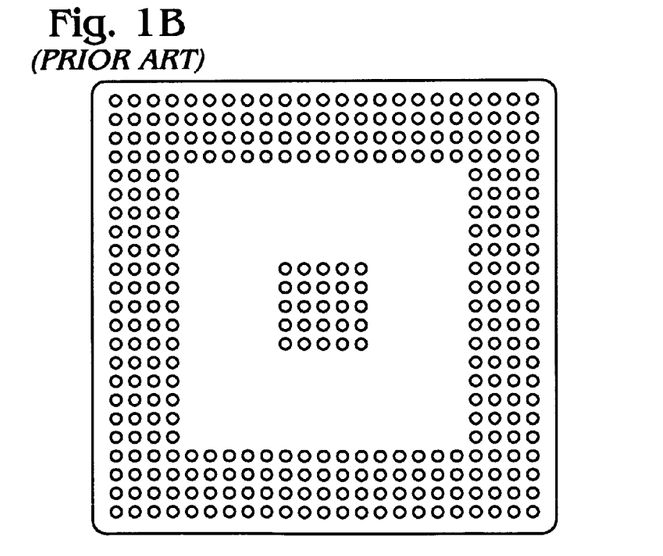

FIGS. 1A and 1B are perspective views of a dual in-line package (DIP) and an IC die without a package, respectively (prior art). It is common for a package body or lead frame 100 to have a die attach area 102. The die 106 has electrical contact pads on its top surface. Inner leads 108 connect pads on die top surface to outer leads or lead frames 110. Once the inner leads are bonded to the lead frames, the package is sealed with ceramic, in a metal can, or in a polyimide. Epoxy resins are also a common choice. Glass beads are commonly mixed in with the epoxy to reduce strain in the epoxy film during changes in temperature.

Optical beam induced current (OBIC) is a semiconductor analysis technique performed using laser signal injection. The technique induces current flow in the semiconductor sample through the use of a laser light source. By monitoring current flow or voltage changes on the leads, and cross-referencing to the position of the laser, it is possible estimate the particular devices being effected. This technique is used in semiconductor failure analysis to locate buried diffusion regions, damaged junctions, and gate oxide shorts.

Figure 9:
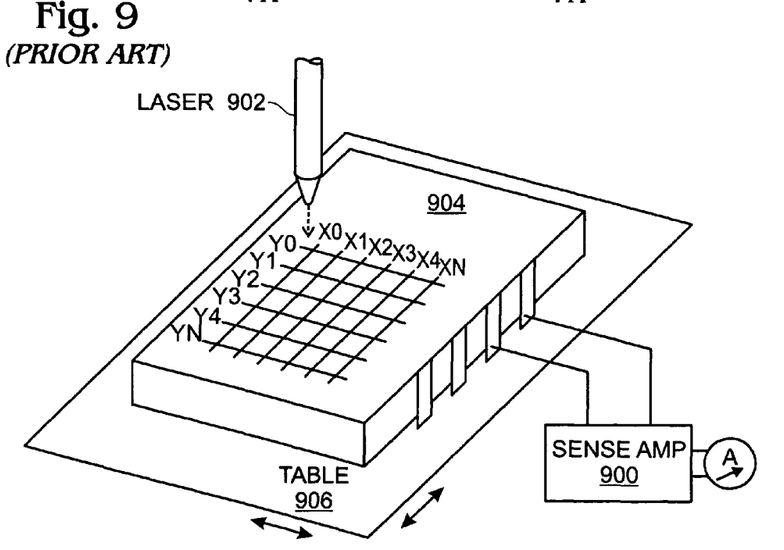
FIG. 9 depicts an exemplary system for detecting infrared paths through an IC package (prior art).

FIG. 9 depicts an exemplary system for inducing current flow by creating optical paths through an IC package (prior art). Selected power pins from the IC are connected to a sense amp 900, as are the IC grounds. A laser 902 scans an area of an IC package 904 overlying the die (not shown). The scanning area is defined by an x-y coordinate system. The IC package 904 is mounted on a movable table 906. Alternately, the IC package position is fixed and the laser moves. The scan pattern need not necessarily follow the x-y grid. In some aspects, only selected areas of the package surface over the die are scanned.

Figure 10:
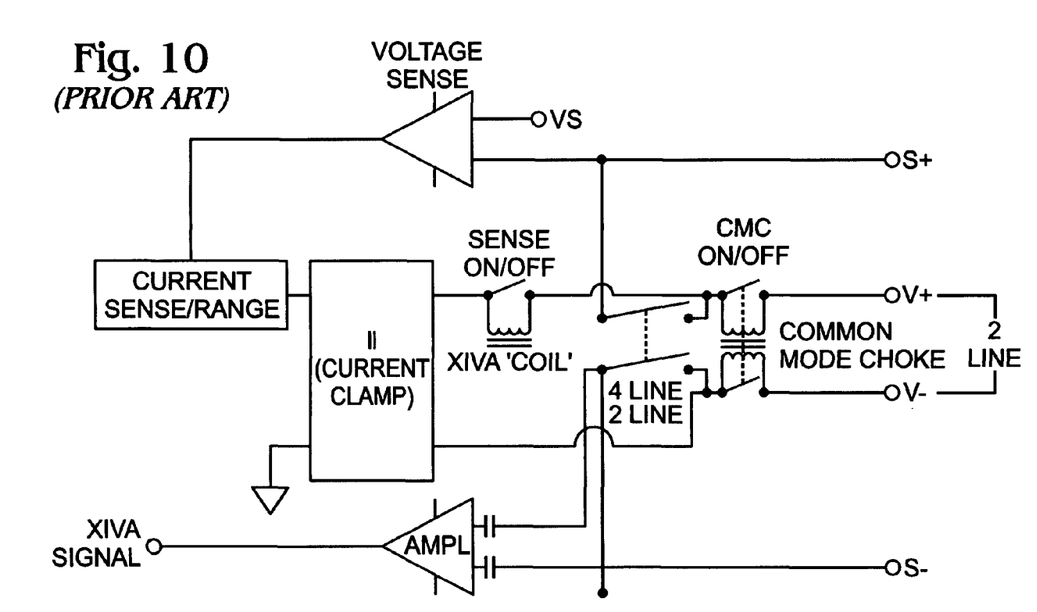
FIG. 10 is a detailed schematic of a sense amplifier (prior art).

FIG. 10 is a detailed schematic of a sense amplifier (prior art). The sense amplifier connects lines V+ and S+ to IC power supply lines, while inputs V− and S− are typically connected to ground. In other aspects, the sense amplifier lines may be connected to signal inputs or signal outputs.

Imaging is performed through the top or the bottom of the package with the epoxy compound intact. Electrical connections are made to the power supply pins of the device and those connections go to a current amplifier for video imaging the package surface as the OBIC laser is scanned. The OBIC laser has a 1065 nanometers wavelength and does not ablate the epoxy mold compound. This wavelength will generate electron hole pairs in the semiconductor die and create a current if the laser light reaches the die surface (and the junctions are not covered by metal).

The OBIC technique may be used to detect the point at which a focused ion beam (FIB) milling operation in bulk silicon of an IC must be terminated. This is accomplished by using a laser to induce a photocurrent in the silicon, while simultaneously monitoring the magnitude of the photocurrent by connecting an ammeter to the device's power and ground. As the bulk silicon is thinned, the photocurrent increases as the depletion region of the well to substrate junction is reached. FIB milling operations are terminated in a region below the well depth, so the device remains operational.

IC dies are fabricated from multiple layers of metal, silicon active devices, interconnections, and dielectric insulation. Typically, one or more metal layer is located near the top of the die for the purpose of distributing power and to act as ground. Since lasers cannot image through these metal layers, laser imaging for fault location is commonly performed from the back of the die to produce an image in the X-Y plane using a technique that is commonly called TIVA (thermally induced voltage alteration). Defects are often more thermally sensitive than non defect sites.

Figure 2:
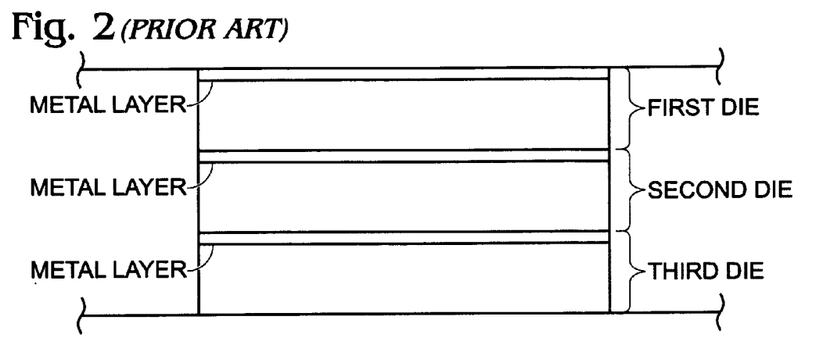
FIG. 2 is a partial cross-sectional view of an IC made from a stack of dies (prior art).

FIG. 2 is a partial cross-sectional view of an IC made from a stack of dies (prior art). A new generation of IC devices is emerging that vertically stacks a plurality of dies. Even if the bottom-most die can be investigated using a conventional TIVA technique, its metal layers prevent TIVA analysis the overlying dies.

Therefore, new analysis techniques are required. CAT SCANS (x-rays) and NMR imaging produce two and three dimensional images by combining information from multi-directions initially collected individually.

It would be advantageous the two and three dimensional imaging techniques developed for medicine could be applied to the analysis of ICs. It would be advantageous if a die could be analyzed in multiple dimensions using an TIVA tool.

SUMMARY OF THE INVENTION

Disclosed herein are a tool and analysis method designed to address the above-mentioned problems. Generally, the method locates IC defect location using infrared (IR) or near infrared laser imaging through the sides of the integrated circuit. This approach enables fault location or defect site location on an integrated circuit when the top of the die or the back of the die (i.e. the conventional approaches) are obscured as a result of stacked dies or other packing configurations.

Accordingly, a method is provided for three-dimensional integrated circuit (IC) failure analysis. An IC (die) is provided having top and bottom surfaces, a perimeter, and a first side along the perimeter in an X plane and an orthogonal Y plane, between the top and bottom surfaces. The IC is electrically connected to a current sensing amplifier. The first side of the IC is scanned in the X plane with an infrared laser beam while changes in IC current flow are sensed. The sensed current changes are cross-referenced to the location of the infrared laser beam in the X plane. In one aspect, a plurality of scans are performed on the first side in the X plane, with at a corresponding plurality of steps in the Y plane, so that current changes can be cross-referenced to locations in the X and Y planes. Using this 2-D analysis through the IC side, a human operator or software program can determine defect locations in the IC.

A different type of 2-D analysis can be performed, where a plurality of scans is performed on the first side in the X plane at a corresponding plurality of focal lengths in a Z plane, orthogonal to the X and Y planes. Then, sensed current changes can be cross-referenced to locations in the X and Z planes. The 2-D analysis in the X and Y planes when combined with the 2-D analysis in the X and Z planes creates a 3-D measurement. A 3-D measurement can also be performed by imaging through a second side of the IC, and combining the results of the second side imaging with the results of the first side imaging.

Additional details of the above-described method and a reflector tool for 3-D IC failure analysis, are provided below.

DETAILED DESCRIPTION

Figure 3A:
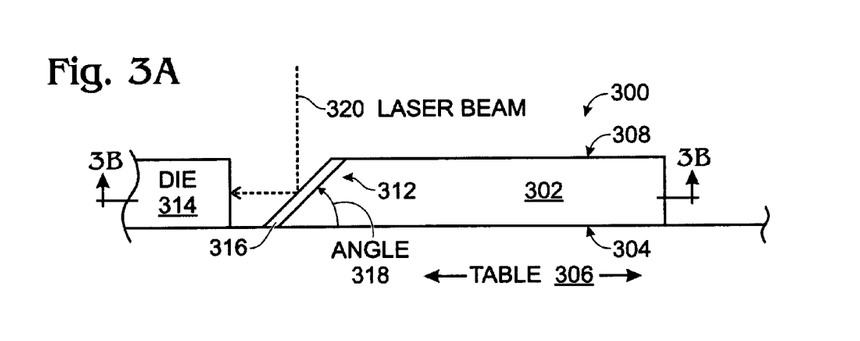
FIGS. 3A and 3B are partial cross-sectional and plan views, respectively, of an infrared laser beam reflector tool for three-dimensional IC failure analysis.
Figure 3B:
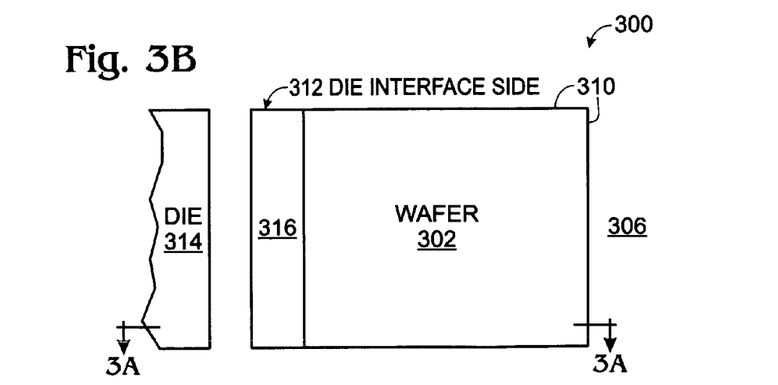

FIGS. 3A and 3B are partial cross-sectional and plan views, respectively, of an infrared laser beam reflector tool for three-dimensional IC failure analysis. The reflector tool 300 comprises a silicon wafer 302 having a horizontal bottom surface 304 for mounting on an infrared laser beam table 306, a horizontal top surface 308, a perimeter 310, and a die interface side 312 along the perimeter 310 between the top 308 and bottom 304 surfaces for interfacing with an IC die 314 under test. The wafer could be made from a number of materials. Silicon is used as an example because it is readily available and inexpensive. A metalized reflector surface 316 is formed in the die interface side 312 at an angle 318 between the top 308 and bottom 304 surfaces, which is acute from the perspective of the bottom surface 304. An infrared laser beam 320 is translated from the top surface 308, to the die interface side 312. In this aspect, the reflector surface 316 is formed directly on the die interface side 312.

As shown, the reflector surface 316 is formed at an angle of about 45°. Assuming the laser beam is normal to the reflector tool top surface 308, the translated laser beam emerges from the die interface side 312 parallel to the surface of the table 306. However, the reflector surface 316 may be formed at other angles if desired, as explained in more detail below. Also, the laser beam need not necessary be normal to the wafer top surface 308.

Figure 4:
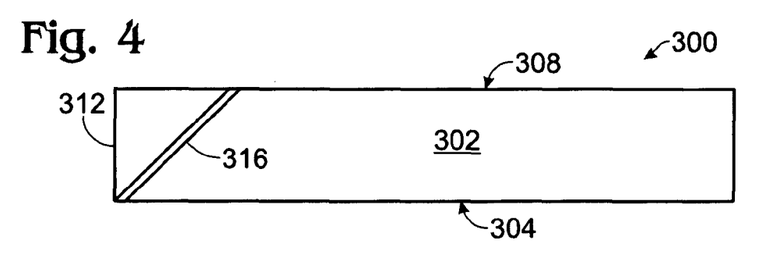
FIG. 4 is a partial cross-sectional diagram depicting a first variation of the reflector tool of FIGS. 3A and 3B.

FIG. 4 is a partial cross-sectional diagram depicting a first variation of the reflector tool of FIGS. 3A and 3B. In this aspect, the die interface side 312 forms a vertical exterior surface orthogonal to the top 308 and bottom 304 surfaces. The reflector surface 316 is an interior surface adjacent the die interface side 312. In this aspect, the wafer 302 is silicon, or some other material transparent at the same wavelengths as silicon, assuming that the laser is being used to image a silicon IC die. The silicon wafer area covering the reflector surface is optically transparent to IR and near-IR lasers, and the covering protects the reflector surface from damage.

Figure 5:
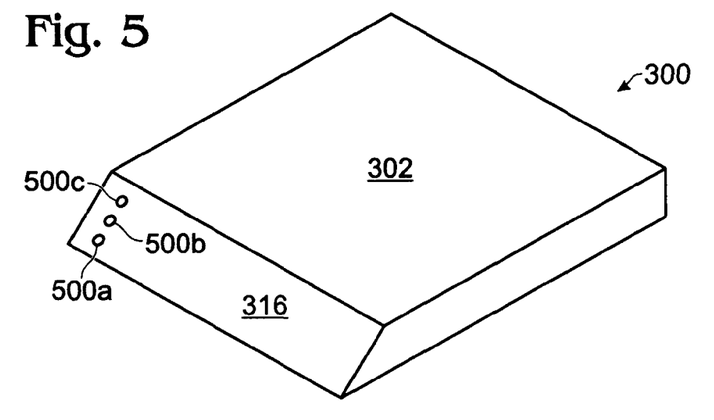
FIG. 5 is a perspective view depicting a second variation of the reflector tool of FIGS. 3A and 3B.

FIG. 5 is a perspective view depicting a second variation of the reflector tool of FIGS. 3A and 3B. In this aspect, a target alignment marker 500 is formed in the reflector surface 316. A laser beam directed at the target alignment marker 500 is translated from the die interface side 312 at a predetermined height above the laser beam table. As shown, a plurality of graduated target alignment markers 500a, 500b, and 500c are formed in the reflector surface. An infrared laser beam directed at one of the plurality of target alignment markers 500 is translated from the die interface side 312 at one of a corresponding plurality of predetermined heights above the infrared laser beam table.

For example, marker 500a may be used when a height of 1000 nanometers (nm) above the table is desired, while marker 500b can be used for a height of 3000 nm. If the laser beam is orthogonal the wafer top surface 308 and the reflector surface 316 is at a 45 degree angle, then the targeted heights are parallel to the table surface. More complicated, varying heights can be targeted if the laser beam is not normal to the top surface 308 or if the reflector surface 316 is an angle other than 45 degrees. The reflector tool is not limited to any particular number of target alignment markers.

In another aspect, the alignment marks are created as part of the imaging process. For example, if an electrical reaction is observed at a particular (Y plane) height in the IC, the reflector surface can be marked in the dimension needed to create that height. Then, when imaging is to be performed in the X or Z plane, or if the IC is turned to image a different side, the critical height can be easily be found by aligning the beam to the mark.

Figure 6A:
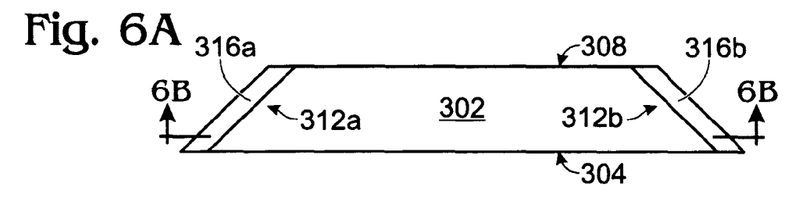
FIGS. 6A and 6B are partial cross-sectional and plan views, respectively, of a third variation of the reflector toll of FIGS. 3A and 3B.
Figure 6B:
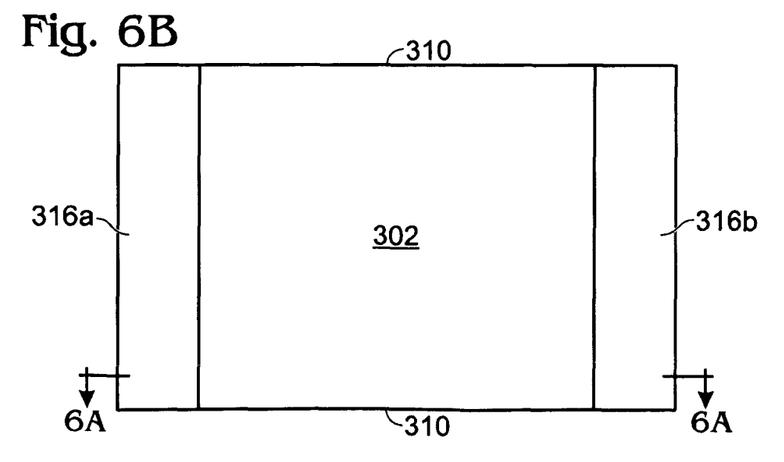

FIGS. 6A and 6B are partial cross-sectional and plan views, respectively, of a third variation of the reflector tool of FIGS. 3A and 3B. In this aspect, the silicon wafer 302 includes a plurality of die interface sides 312 along the perimeter 310 between the top 308 and bottom 304 surfaces for interfacing with an IC die under test. The tool includes a plurality of metalized reflector surfaces 316, one formed in each die interface side 312, at a corresponding plurality of acute angles between the top 308 and bottom 304 surfaces, for translating an infrared laser beam from the top surface 308, to the corresponding die interface side 312.

In this example, 2 die interface sides 312a and 312b are shown with corresponding reflector surfaces 316a and 316b. However, a 4-sided wafer could also be formed with 3 or 4 die interface sides (not shown).

Figure 7A:
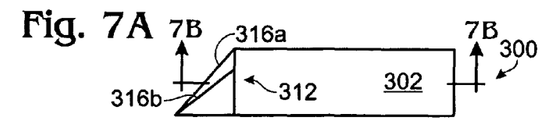
FIGS. 7A and 7B are partial cross-sectional and plan views, respectively, of a fourth variation of the reflector toll of FIGS. 3A and 3B.
Figure 7B:
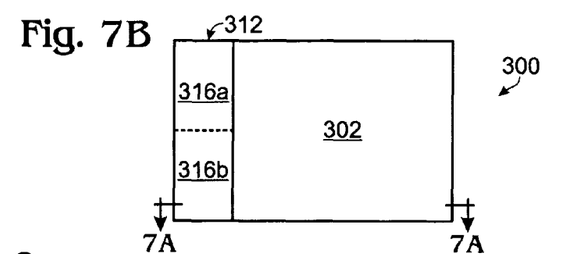

FIGS. 7A and 7B are partial cross-sectional and plan views, respectively, of a fourth variation of the reflector tool of FIGS. 3A and 3B. In this aspect, a plurality of metalized reflector surfaces 316 is formed in the die interface side 312 at a corresponding plurality of angles between the top and bottom surfaces. Shown are reflector surfaces 316a and 316b. For example, reflector surface 316a may be formed at an angle of 47 degrees, while reflector surface 316b is formed at an angle of 43 degrees. Although an example of 2 reflector sources is shown, the tool is not limited to any particular number.

The reflector tool described above has been presented in the context of optical beam imaging performed in the infrared and near-infrared wavelengths. However, the tool, or minor modifications of the presented tool might be used for other types of focused beam processes, such as FIB milling the side of an IC. Other processes may involve the use of a scanning electron microscope (SEM) or E-beam.

Functional Description

The above-described tool is used to enable laser scans through one of the edges of an integrated circuit, and changes in electrical signals from the IC, responsive to the laser position, are recorded. As an alternative to using the reflector tool, the IC may be stood on edge, so that the IC side accepts the laser scan without the need for beam translation. However, this method may require an IC fixture to ensure stability. As another alternative, one of the IC sides can be polished and covered with a reflective metal layer, see FIG. 11.

After the first set of scans, the laser may scan through an edge at 90 degrees from the first edge, and the change in electrical response is again recorded as a function of laser position. The information collected from scans in two different directions is combined to locate defects.

For example, the maximum response in the first direction is a coordinate in the x-axis, and the maximum response in the second direction is the z-coordinate of the defect. In the case of stacked die, where a defect such as a short may be in one of several of the die, each die edge can be scanned sequentially for an electrical response indicative of a short. Thus, the die containing the short can be identified without destructive analysis, such as having to physically separate the die.

To examine packages that may be susceptible to this failure mechanism, Optical Beam Induced Current (OBIC) and Thermally Induced Voltage Alteration (TIVA) laser imaging techniques can be used to electrically detect optical transmission through thin packages. The integrated circuit under test acts as a detector while the laser is scanned on the outside of the package. In one aspect, the TIVA laser causes some heating of the IC and the resultant resistance change is detected electronically through the leads of the device. The TIVA laser causes the generation of electron-hole pairs in the crystal silicon die that result in a current that is then detected as a voltage at the pins of the device. In some aspects, both TIVA and OBIC lasers are used simultaneously.

Figure 8:
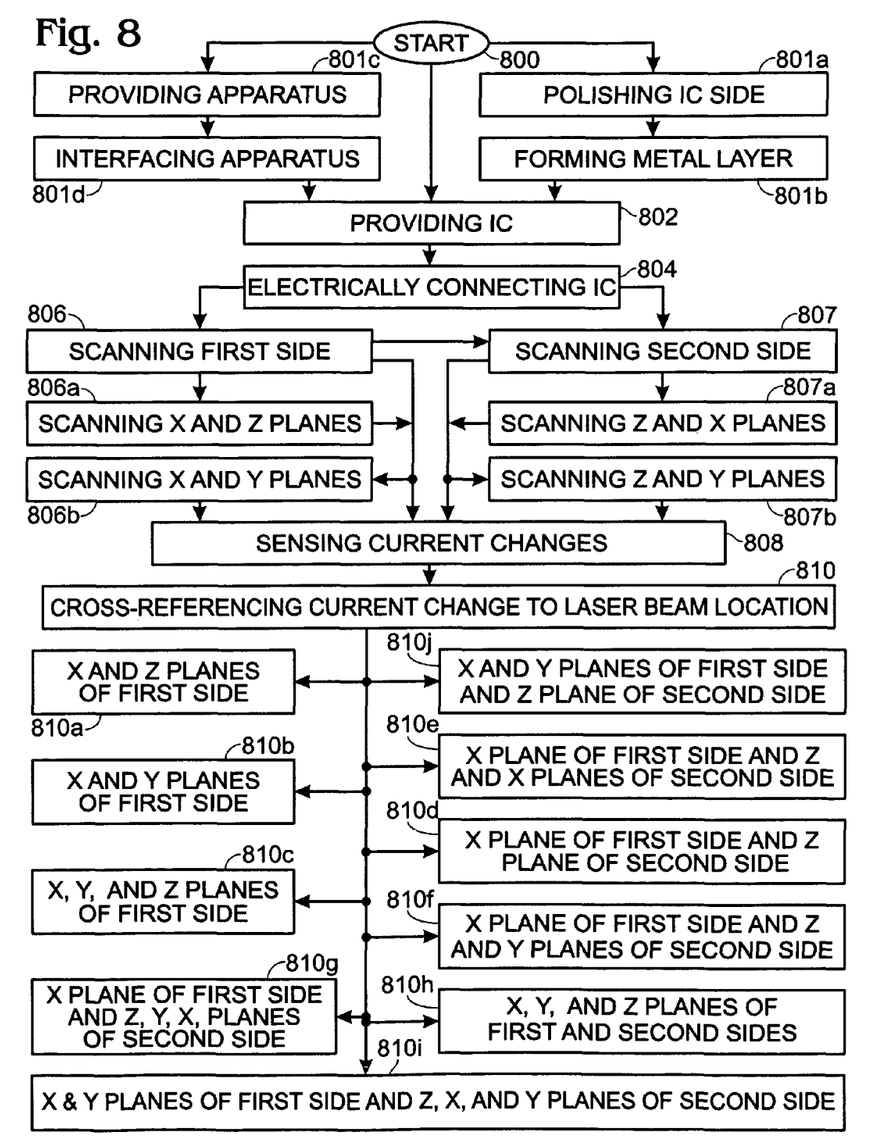
FIG. 8 is a flowchart illustrating a method for three-dimensional IC failure analysis.

FIG. 8 is a flowchart illustrating a method for three-dimensional IC failure analysis. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 provides an IC having top and bottom surfaces, a perimeter, and a first side along the perimeter in an X plane and an orthogonal Y plane, between the top and bottom surfaces. Step 804 electrically connects the IC to a current sensing amplifier. Step 806 scans the first side of the IC in the X plane with an infrared laser beam. If used for imaging through silicon, the optical laser beam typically has a wavelength of greater than 1,100 nanometers. Step 808 senses changes in IC current flow. Step 810 cross-references sensed current changes to the location of the infrared laser beam in the X plane.

In one aspect, scanning the first side of the IC in Step 806a includes scanning the first side with a plurality of scans in the X plane, performed at a corresponding plurality of focal lengths in a Z plane, orthogonal to the X and Y planes. The focal length may be changed by moving the relative positions of the laser and IC, or by adjusting an interposing lens. See FIG. 12 for a presentation of the X, Y, and Z planes of the IC die. Then, cross-referencing sensed current changes to the location of the infrared laser beam in Step 810a includes cross-referencing current changes to locations in the X and Z planes of the first side.

In another aspect, Step 806b scans the first side with a plurality of scans in the X plane, performed at a corresponding plurality of steps in the Y plane, and Step 810b cross-references current changes to locations in the X and Y planes of the first side. Further, if Step 806a (scanning the first side with a plurality of scans in the X plane, performed at a corresponding plurality of focal lengths in a Z plane, orthogonal to the X and Y planes) is performed along with Step 806a, then Step 810c cross-references current changes to locations in the X, Y, and Z planes of the first side.

For example, if Step 806b initially scans the first side in the X and Y planes, Step 810c cross-references current changes to locations in the X, Y, and Z planes in a combination of steps. First, Step 810b determines a 2-D location in the X and Y planes associated with an initial current change. Then, if Step 806a scans the first side with a plurality of scans in the 2-D location, performed at a corresponding plurality of focal lengths in the Z plane, the result is Step 810a. The combination of Steps 810a and 810b are Step 810c, which determines a 3-D location in the X, Y, and Z planes associated with a final current change.

In another aspect, Step 802 provides an IC having second side along the perimeter in the Z and Y planes. A further step, Step 807, scans the second side of the IC in the Z plane with the infrared laser beam, and Step 810d cross-references sensed current changes to the location of the infrared laser beam in the X plane of the first side and the Z plane of the second side.

In one aspect, Step 807a scans the second side with a plurality of scans in the Z plane, performed at a corresponding plurality of focal lengths in the X plane, and Step 810e cross-references current changes to the location of the infrared laser beam in the X plane of the first side and the Z and X planes of the second side.

In another aspect, Step 807b scans the second side with a plurality of scans in the Z plane, performed at a corresponding plurality of steps in the Y plane, and Step 810f cross-references current changes to the location of the infrared laser beam in the X plane of the first side and the Z and Y planes of the second side.

In yet another aspect, Step 807a (scanning the second side with a plurality of scans in the Z plane, performed at a corresponding plurality of focal lengths in a X plane) is performed in combination with Step 807b, and Step 810g cross-references current changes to the location of the infrared laser beam in the X plane of the first side and the X, Y, and Z planes of the second side.

If Steps 806a (scanning the first side with a plurality of scans in the X plane, performed at a corresponding plurality of focal planes in a Z plane) is combined with Step 806b (scanning the first side with a plurality of scans in the X plane, performed at a corresponding plurality of steps in the Y plane), Step 807a, 807b, and 807c, then Step 810h cross-references current changes to the location of the infrared laser beam in the X, Y, and Z planes of the first side and the X, Y, and Z planes of the second side.

If Steps 807a and 807b are combined with Step 806b (scanning the first side with a plurality of scans in the X plane, performed at a corresponding plurality of steps in the Y plane), then Step 810i cross-references current changes to the location of the infrared laser beam in the X and Y planes of the first side and the Z, X, and Y planes of the second side.

If Step 806b is combined with Step 807, Step 810b initially cross-references current changes to the location of the laser beam in the X and Y planes (Step 810b) to determine a 2-D location in the X and Y planes associated with an initial current change. After the performance of Step 807, where the second side is scanned with a plurality of scans in the Z plane, with a focal length at the 2-D location, Step 810j of determines a final current changed associated with a 3-D location derived from the X and Y planes of the first side, and the Z plane of the second side.

Figure 11:
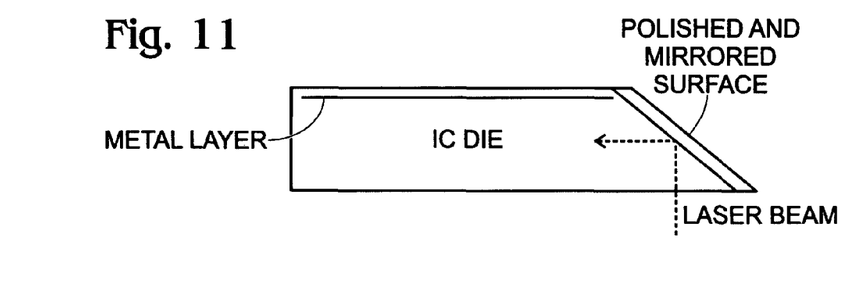
FIG. 11 is a partial cross-sectional view of an IC die with surface that is polished and mirrored.

In another variation, Step 801 polishes the first side of the IC, creating a first side with an angled surface in the Z plane, and Step 801b forms a metal layer overlying the first side angled surface, see FIG. 11. Then, scanning the first side in the X plane (Step 806) includes: scanning the bottom surface of the IC in the Y plane; and, reflecting the scan off the first side metal layer into the X plane. In another variation, Step 801c provides a reflector tool, mirror, or lens. Step 801d interfaces the apparatus with the IC under test. The apparatus can be placed adjacent to an IC under test, or attached to the IC, depending on the design of the tool. Then, scanning the first side of the IC with an infrared laser beam in Step 806 includes using the apparatus in scanning the IC.

FIG. 11 is a partial cross-sectional view of an IC die with surface that is polished and mirrored.

Figure 12:
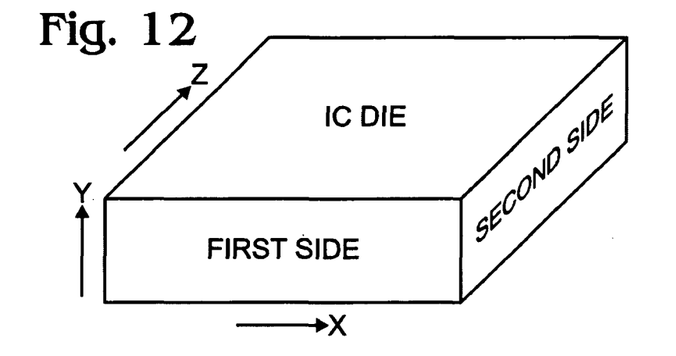
FIG. 12 is a perspective view of an IC showing the first and second sides, as well as the X, Y, and Z planes.

FIG. 12 is a perspective view of an IC showing the first and second sides, as well as the X, Y, and Z planes.

Figure 13:
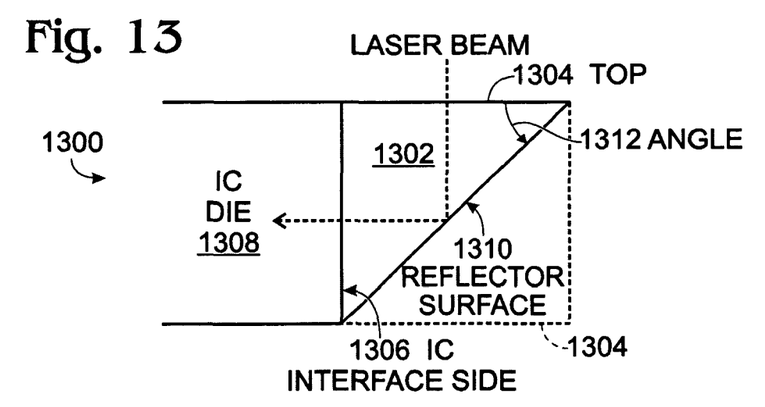
FIG. 13 is a partial cross-sectional view of a fifth variation of the reflector toll for 3-D IC failure analysis.

FIG. 13 is a partial cross-sectional view of a fifth variation of the reflector toll for 3-D IC failure analysis. The tool 1300 is comprised of a wafer 1302 that is transparent at the laser wavelength being used. For example, the wafer is silicon if an IR laser is used. The wafer 1302 has a horizontal top surface 1304 and a die interface side 1306 for interfacing with an IC die under test 1308. As shown, an optical glue attaches the die interface side 1306 to the side of the IC 1308. An optical glue is a glue that is transparent at the laser wavelength in use. A metalized reflector surface 1310 is formed at an angle 1312 between the top surface 1304 and the die interface side 1306. The angle 1312 is acute from the perspective of the top surface 1304 (e.g., 45 degrees). The reflector surface 1310 translates an infrared laser beam from the top surface 1304 to the die interface side 1306.

In another aspect, the tool 1300 has a horizontal bottom surface 1314, shown in phantom, which permits the tool to be used without glue, or which simplifies the gluing process.

Figure 14A:
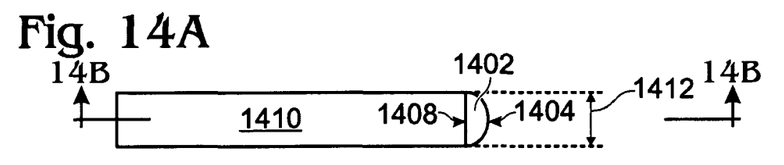
FIGS. 14A and 14B are partial cross-sectional and plan views, respectively, or an infrared laser beam lens for 3-D IC failure analysis.
Figure 14B:
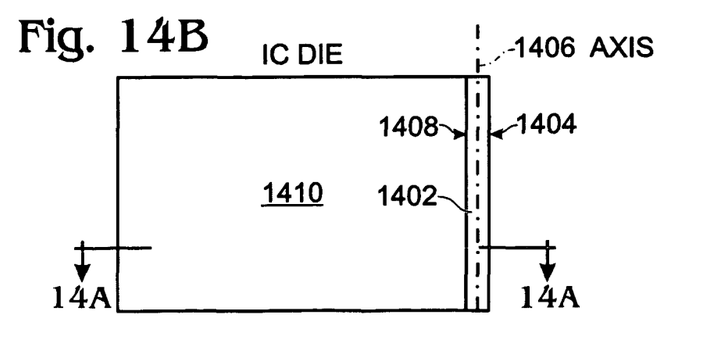

FIGS. 14A and 14B are partial cross-sectional and plan views, respectively, or an infrared laser beam lens for 3-D IC failure analysis. The lens 1400 comprises an optical fiber 1402. The optical fiber 1402 includes an unpolished hemicylindrical laser interface surface 1404 aligned in parallel with a central fiber axis 1406. The lens also includes a flat IC interface surface 1408 aligned in parallel with the central fiber axis 1406, for attachment to a side of an IC under test 1410.

Typically, an optical glue attached the flat surface 1408 to the side of the IC 1410. This cylindrical lens may also be referred to as a bar lens. It is also typical that the fiber is polished to have a width 1412 that is greater than 50% of the original fiber diameter (before polishing). The optical fiber 1402 shown is the fiber core, without any buffering, cladding, or a jacket. Additional details concerning optical fiber lens may be found in pending application Ser. No. 12/352,640.

A reflector tool and method for 3-D IC imaging have been provided. Examples of focused beam types, structural components, and applications have been given to illustrate the invention. However, the invention is not limited to merely these examples. Other variations and embodiments of the invention will occur to those skilled in the art.

I claim:

1. A method for three-dimensional integrated circuit (IC) failure analysis, the method comprising:
   providing an IC having top and bottom surfaces, a perimeter, and a first side along the perimeter in an X plane and an orthogonal Y plane, between the top and bottom surfaces;
   electrically connecting the IC to a current sensing amplifier;
   scanning the first side of the IC in the X plane with an infrared laser beam;
   sensing changes in IC current flow; and
   cross-referencing sensed current changes to the location of the infrared laser beam in the X plane of the first side.

2. The method of claim 1 wherein scanning the first side of the IC includes scanning the first side with a plurality of scans in the X plane, performed at a corresponding plurality of focal lengths in a Z plane, orthogonal to the X and Y planes; and,
   wherein cross-referencing sensed current changes to the location of the infrared laser beam includes cross-referencing current changes to locations in the X and Z planes of the first side.

3. The method of claim 1 wherein scanning the first side of the IC includes scanning the first side with a plurality of scans in the X plane, performed at a corresponding plurality of steps in the Y plane; and,
   wherein cross-referencing sensed current changes to the location of the infrared laser beam includes cross-referencing current changes to locations in the X and Y planes of the first side.

4. The method of claim 3 wherein scanning the first side of the IC includes scanning the first side with a plurality of scans in the X plane, performed at a corresponding plurality of focal lengths in a Z plane, orthogonal to the X and Y planes; and,
   wherein cross-referencing sensed current changes to the location of the infrared laser beam includes cross-referencing current changes to locations in the X, Y, and Z planes in the first side.

5. The method of claim 4 wherein cross-referencing current changes to locations in the X, Y, and Z planes includes determining a 2-D location in the X and Y planes associated with an initial current change;
   wherein scanning the first side of the IC includes scanning the first side with a plurality of scans in the 2-D location, performed at a corresponding plurality of focal lengths in the Z plane; and,
   wherein cross-referencing current changes to locations in the X, Y, and Z planes includes determining a 3-D location in the X, Y, and Z planes associated with a final current change.

6. The method of claim 1 wherein providing the IC includes providing an IC having second side along the perimeter in the Z and Y planes;
   the method further comprising:
   scanning the second side of the IC in the Z plane with the infrared laser beam; and,
   wherein cross-referencing sensed current changes to the location of the infrared laser beam in the X plane includes cross-referencing sensed current changes to the location of the infrared laser beam in the X plane of the first side and the Z plane of the second side.

7. The method of claim 6 wherein scanning the second side of the IC in the Z plane with the infrared laser beam includes scanning the second side with a plurality of scans in the Z plane, performed at a corresponding plurality of focal lengths in the X plane; and,
wherein cross-referencing sensed current changes to the location of the infrared laser beam includes cross-referencing current changes to the location of the infrared laser beam in the X plane of the first side and the Z and X planes of the second side.

8. The method of claim 7 wherein scanning the second side of the IC includes scanning the second side with a plurality of scans in the Z plane, performed at a corresponding plurality of steps in the Y plane; and,
wherein cross-referencing sensed current changes to the location of the infrared laser beam includes cross-referencing current changes to the location of the infrared laser beam in the X plane of the first side and the Z and Y planes of the second side.

9. The method of claim 8 wherein scanning the second side of the IC includes scanning the second side with a plurality of scans in the Z plane, performed at a corresponding plurality of focal lengths in a X plane; and,
wherein cross-referencing sensed current changes to the location of the infrared laser beam includes cross-referencing current changes to the location of the infrared laser beam in the X plane of the first side and the X, Y, and Z planes of the second side.

10. The method of claim 9 wherein scanning the first side of the IC includes:
scanning the first side with a plurality of scans in the X plane, performed at a corresponding plurality of focal planes in a Z plane; and,
scanning the first side with a plurality of scans in the X plane, performed at a corresponding plurality of steps in the Y plane; and,
wherein cross-referencing sensed current changes to the location of the infrared laser beam includes cross-referencing current changes to the location of the infrared laser beam in the X, Y, and Z planes of the first side and the X, Y, and Z planes of the second side.

11. The method of claim 8 wherein scanning the first side of the IC includes scanning the first side with a plurality of scans in the X plane, performed at a corresponding plurality of steps in the Y plane; and,
wherein cross-referencing sensed current changes to the location of the infrared laser beam includes cross-referencing current changes to the location of the infrared laser beam in the X and Y planes of the first side and the X, Z, and Y planes of the second side.

12. The method of claim 6 wherein scanning the first side of the IC includes scanning the first side with a plurality of scans in the X plane, performed at a corresponding plurality of steps in the Y plane;
wherein cross-referencing current changes to the location of the infrared laser beam in the X and Y planes of the first side includes determining a 2-D location in the X and Y planes associated with an initial current change;
wherein scanning the second side of the IC includes scanning the second side with a plurality of scans in the Z plane, with a focal length at the 2-D location; and,
wherein cross-referencing current changes to a final current change associated with a 3-D location derived the X and Y planes of the first side and the Z plane of the second side.

13. The method of claim 1 further comprising:
polishing the first side of the IC, creating a first side with an angled surface in the Z plane;
forming a metal layer overlying the first side angled surface;
wherein scanning the first side in the X plane includes:
scanning the bottom surface of the IC in the Y plane; and,
reflecting the scan off the first side metal layer into the X plane.

14. The method of claim 1 further comprising:
providing an apparatus selected from a group consisting of a reflector tool, mirror, and lens;
interfacing the apparatus with the 1C under test; and,
wherein scanning the first site of the IC with an infrared laser beam includes using the apparatus in scanning the IC.

15. An infrared laser beam reflector tool for three-dimensional integrated circuit (IC) failure analysis, the reflector tool comprising:
a silicon wafer having a horizontal bottom surface for mounting on an infrared laser beam table, a horizontal top surface, a perimeter, and a die interface side along the perimeter between the top and bottom surfaces for interfacing with an IC die under test; and,
a metalized reflector surface formed in the die interface side at an angle between the top and bottom surfaces, which is acute from the perspective of the bottom surface, for translating an infrared laser beam from the top surface, to the die interface side.

16. The reflector tool of claim 15 wherein the reflector surface is formed at an angle of about 45°.

17. The reflector tool of claim 15 wherein the die interface side forms a vertical exterior surface orthogonal to the top and bottom surfaces; and,
wherein the reflector surface is an interior surface adjacent the die interface side.

18. The reflector tool of claim 15 further comprising:
a target alignment marker formed in the reflector surface; and,
wherein an infrared laser beam directed at the target alignment marker is translated from the die interface side at a predetermined height above the infrared laser beam table.

19. The reflector tool of claim 18 further comprising:
a plurality of graduated target alignment markers formed in the reflector surface; and,
wherein a focused beam directed at one of the plurality of target alignment markers is translated from the die interface side at one of a corresponding plurality of predetermined heights above the infrared laser beam table.

20. The reflector tool of claim 15 wherein the silicon wafer includes a plurality of die interface sides along the perimeter between the top and bottom surfaces for interfacing with an IC die under test; and,
a plurality of metalized reflector surfaces, one formed in each die interface side, at a corresponding plurality of acute angles between the top and bottom surfaces, for translating an infrared laser beam from to the top surface, to the corresponding die interface side.

21. The reflector toll of claim 15 wherein a plurality of metalized reflector surfaces is formed in the die interface side at a corresponding plurality of angles between the top and bottom surfaces.

* * * * *